(12) United States Patent  
Yan

(10) Patent No.: US 6,818,357 B2  
(45) Date of Patent: Nov. 16, 2004

(54) PHOTOLITHOGRAPHIC MASK FABRICATION

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 188 days.

(21) Appl. No.: 09/969,156

(22) Filed: Oct. 3, 2001

(65) Prior Publication Data

US 2003/0064296 A1 Apr. 3, 2003

(51) Int. Cl.$^7$ .............................. G03F 9/00; G21K 5/00
(52) U.S. Cl. ............................................ 430/5; 378/35
(58) Field of Search ..................... 430/5, 322; 403/322; 428/432; 378/35

(56) References Cited

U.S. PATENT DOCUMENTS

| | | | |
|---|---|---|---|
| 5,372,916 A | 12/1994 | Ogawa et al. | 430/321 |
| 5,465,859 A | 11/1995 | Chapple-Sokol et al. | 430/5 |
| 5,700,602 A | 12/1997 | Dao et al. | 430/5 |
| 5,935,737 A | 8/1999 | Yan | 430/5 |
| 5,958,629 A | 9/1999 | Yan et al. | 430/5 |
| 6,007,324 A | 12/1999 | Tzu et al. | 430/5 |
| 6,048,652 A * | 4/2000 | Nguyen et al. | 430/5 |
| 6,178,221 B1 * | 1/2001 | Levinson et al. | 378/35 |
| 6,258,489 B1 | 7/2001 | Stanton et al. | 430/5 |
| 6,294,295 B1 | 9/2001 | Lin et al. | 430/5 |

FOREIGN PATENT DOCUMENTS

| | | |
|---|---|---|
| EP | 0 569 123 A2 | 11/1993 |
| JP | 11-305417 | 11/1999 |

OTHER PUBLICATIONS

Pei–yang Yan et al., "EUV Mask Absorber Chacterization and Selection," Photomask and Next–Generation Lithography Mask Technology VII, vol. 4066 pp. 116–123, Apr. 12–13, 2000.

Pei–yang Yan et al., "TaN EUVL Mask Fabrication and Characterization", Emerging Lithographic Technologies V, Proceedings of Society for Optical Engineering vol. 4343 (2001) pp. 409–414.

Chistof Krautschik et al., "The Impact of the EUV Mask Phase Response on the Asymmetry of Bossung Curves as Predicted By Rigorous EUV Mask Simulations," Emerging Lithographic Technologies V, Proceedings of Society for Optical Engineering vol. 4343 (2001) pp. 392–401.

"EUV Lithography– The Successor to Optical Lithography," John E. Bjorkholm, Advanced Lithography Department, Technology and Manufacturing Group, Santa Clara, CA. Intel Corporation, Intel Technology Journal $3^{rd}$ Quarter, 1998, pp. 1–8.

* cited by examiner

Primary Examiner—S. Rosasco  
(74) Attorney, Agent, or Firm—Fish & Richardson P.C.

(57) ABSTRACT

A photolithographic mask is used in a photolithography imaging system for patterning a semiconductor wafer. The photolithographic mask includes a substrate, and an absorber on the substrate. The absorber is selectively etched to form mask features. In one implementation, the mask includes a thin layer on the substrate, a thickness and material of the thin layer producing a phase correction that offsets a phase error such that a common process window of the mask is maintained above a threshold level. In another implementation, the mask includes a multilayer reflector and portions of the multilayer reflector are etched adjacent to features of the mask. In a further implementation, an index of refraction of the absorber matches or nearly matches an index of refraction of the atmosphere at which the photolithography imaging occurs.

82 Claims, 14 Drawing Sheets

PHOTOLITHOGRAPHIC MASK FABRICATION

TECHNICAL FIELD

This invention relates to fabrication of photolithographic masks for semiconductor processing.

BACKGROUND

Photolithography uses an imaging system that directs radiation onto a patterned mask to form an image that then is projected onto a semiconductor wafer covered with light-sensitive photoresist.

DESCRIPTION OF DRAWINGS

Like reference symbols in the various drawings indicate like elements.

DETAILED DESCRIPTION

1) Overview of Photolithography Imaging System

Photolithography uses an imaging system that directs radiation onto a mask to form a pattern and then projects the image of that pattern, for example, with a reduction of 4:1, onto a semiconductor wafer covered with light-sensitive photoresist. The radiation used in photolithography may be at any suitable wavelength, with the resolution of the system improving with decreasing wavelength. As resolution improves, the ability to print smaller features onto the semiconductor wafer improves.

One type of photolithography system uses radiation in the extreme ultraviolet (EUV) wavelength range. In general, EUV radiation has wavelengths in the range of 1 to 40 nanometers (nm), and the EUV radiation used in photolithography has wavelengths in the range of 10 to 14 nm. Photolithography carried out with radiation in this region has come to be known as EUV lithography (EUVL).

Figure 1:
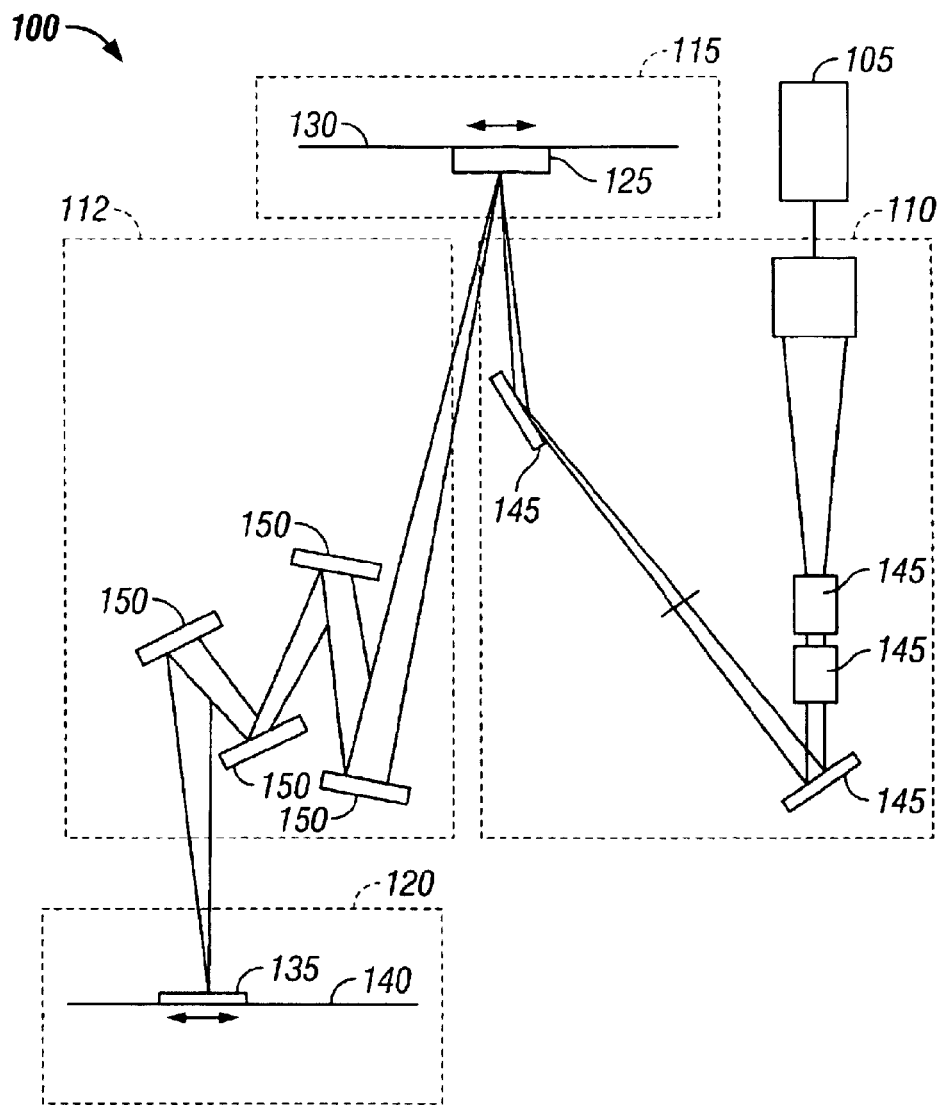
FIG. 1 is a block diagram of a photolithography imaging system that uses a mask in processing a wafer.

Referring to FIG. 1, an EUVL imaging system 100 includes a radiation source 105, a condenser optics section 110, a projection optics section 112, a mask stage 115, and a wafer stage 120. For ease of discussion, the implementations that are discussed relate to EUVL imaging systems. However, the methods and systems described are not limited to EUVL imaging systems. Rather, they may be used in any photolithography imaging system that uses a mask, and in some instances, a reflective mask. They also may be used in a photolithography imaging system that uses a transmissive mask.

The radiation source 105 may be any source able to produce radiation in the extreme ultraviolet (EUV) wavelength range. One example of a suitable radiation source 105 is a plasma created when a laser, such as a 1700 Watt (W) pulsed ytterbium-aluminum-garnet (YAG) solid-state laser, illuminates a gas, such as a supersonic jet of xenon gas. As another example, a suitable radiation source 105 may be formed using bending magnets and undulators associated with synchrotrons. As a further example, a suitable radiation source 105 may be formed or developed from discharge sources, which have the potential to provide adequate power in the desired wavelength range. EUV radiation is strongly absorbed in virtually all transmissive materials, including gases and glass. For this reason, EUV imaging is carried out in a near vacuum.

The mask stage 115 includes a mask 125 mounted to a transport stage 130 that scans the mask 125. The mask 125 may be planar, concave, convex, or any suitable shape to permit patterning. In an EUVL imaging system, the mask 125 is reflective because EUW radiation is strongly absorbed in transmissive materials such as lenses, which may be used in traditional photolithography imaging systems.

The wafer stage 120 includes a photoresist-coated semiconductor wafer 135 mounted to a transport stage 140 that scans the wafer 135 in synchrony with the mask 125 and steps the wafer 135 into a position to accept a next image from the mask 125.

The condenser optics section 110 brings the radiation from the source 105 to the mask stage 115. In an EUVL imaging system, the condenser optics are reflective because of the absorption associated with EUV radiation. Accordingly, the condenser optics section 110 includes condenser reflectors or mirrors 145 that collect and focus the radiation from the source 105 onto the mask stage 115. Any number of condenser mirrors 145 may be used, such as, for example, the four shown in FIG. 1.

The projection optics section 112 reduces the image from the mask 125 in the mask stage 115 and forms the image onto wafer 135 in the wafer stage 120. In an EUVL imaging system, the projection optics are reflective because of the absorption associated with EUV radiation. Accordingly, the projection optics section 112 includes reflectors or mirrors 150 that project radiation reflected from the mask 125 onto the wafer. The reflectance spectrum of the mask 125 may be matched to that of the mirrors in the projection optics section 112.

Referring also to FIGS. 2A–2E, traditionally, a reflective mask 225 (FIGS. 2D and 2E) includes a patterned absorber 230 that absorbs EUV radiation, a buffer 235, a multilayer (ML) reflector 240, and an underlying mask blank 241. The mask blank 241 may be any substrate that can handle subsequent fabrication processes and is typically made of a material having a low thermal expansion, such as, for example, ULE™, an ultralow expansion titanium silicate glass made by Corning Corporation of New York. In one implementation the mask blank 241, is 0.64 cm thick. In operation, any radiation incident on the mask 225 (represented by arrow 250 in FIG. 2D) will be absorbed by the patterned absorber 230 or partially reflected (represented by arrow 255 in FIG. 2D) by the ML reflector 240 in the non-patterned region.

Figure 2A:
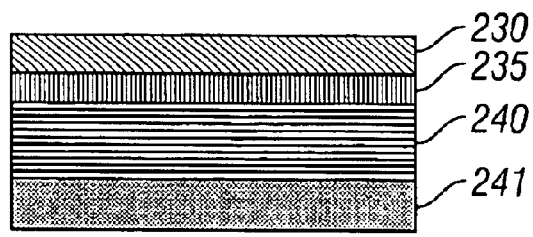
FIGS. 2A–2E are cross-sectional representations of a mask at different phases of a fabrication process.

As shown in FIG. 2A, the ML reflector 240 is formed on the mask blank 241 and generally consists of multiple layers of alternating reflecting material and transmissive material that provide a resonant reflectivity when the period of the layers is approximately one half the wavelength of the radiation used in the imaging system. A number of different combinations of reflective and transmissive materials may be used. In one implementation, the materials are molybdenum (Mo) and silicon (Si), which are alternately layered at thicknesses of about 2 to 12 nm to create a ML reflector thickness of about 50 to 500 nm.

The buffer 235 may be any material that serves as a stop layer or an etch profile controller. The buffer 235 protects the underlying reflector during mask etching and repair while ensuring that etched patterns in the absorber are clean and substantially vertical. The buffer 235 is relatively non-opaque and should be easy to selectively remove or etch. The thickness of the buffer 235 is mostly determined by absorber etch selectivity to the buffer, repair etch selectivity to the ML reflector, and optical inspection contrast. In one implementation, the buffer 235 has a thickness ranging from 30 to 50 nm and is made of silicon dioxide ($SiO_2$). In other implementations, the buffer may be made of carbon (C) or ruthenium (Ru).

The absorber 230 may be any suitable material that is absorptive of radiation at the wavelength used in the imaging system 100 and that can be selectively etched. The thickness of the absorber 230 is mostly determined by the radiation absorption of the material used as the absorber. The absorber 230 may be made of any material or composition that meets these criteria, such as, for example, chromium (Cr), tantalum (Ta), tantalum nitride (TaN), and tantalum boron nitride (TaBN). Typically, if TaN is used, the thickness of the absorber 230 may be in the range of 50 to 100 nm.

As shown in FIG. 2A, the mask 225 is formed by depositing the ML reflector 240 on the mask blank 241. The buffer 235 is placed on top of the ML reflector 240 using any suitable technique such as physical vapor deposition or sputtering techniques. The technique is performed at a temperature selected to avoid modification to the underlying ML reflector 240. Next, the absorber 230 is placed on top of the buffer 235 using any suitable technique such as physical vapor deposition or sputtering techniques.

Figure 2B:
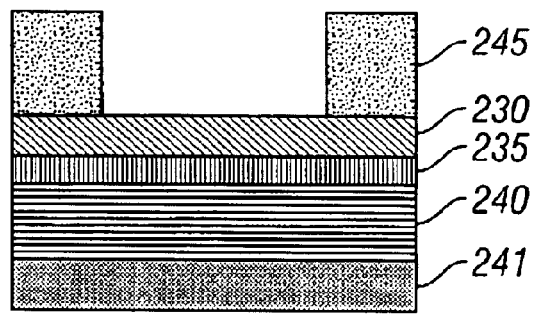
Figure 2C:
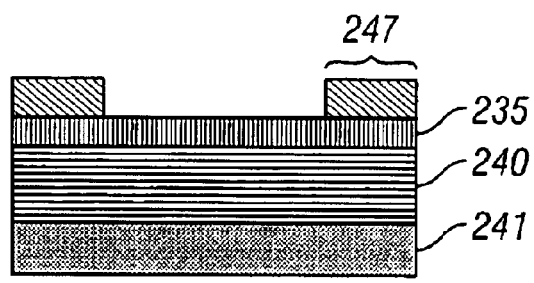
Figure 2D:
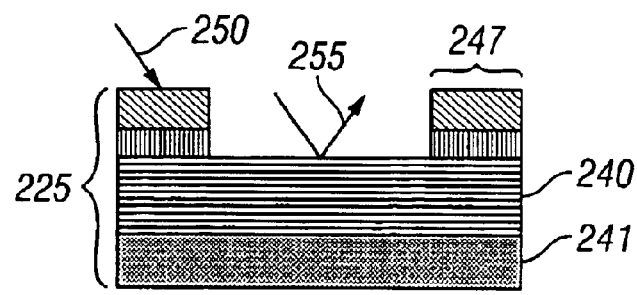
Figure 2E:
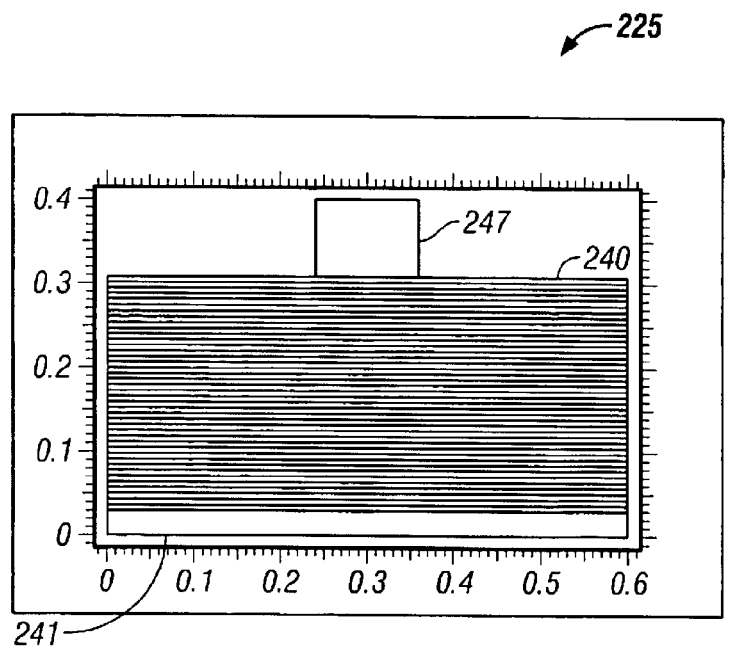

Referring to FIGS. 2B and 2C, the mask 225 is etched using any suitable etching technique. Generally, a layer of photoresist 245 is patterned on top of the absorber 230 and that pattern is replicated into the absorber 230 by etching the absorber 230 in locations not covered by the photoresist 245 to form the mask features 247. The photoresist 245 then is selectively removed and the buffer 235 is etched in locations not covered by the absorber 230 to produce the mask shown in FIGS. 2D and 2E. The etched mask pattern ultimately is used to pattern the semiconductor wafer using the projection optics and the condenser optics, as discussed above. In one implementation, as discussed above, the mask is etched using plasma etching.

2) Phase Correction in Photolithography Imaging System

The mask 225 is characterized by its critical dimensions (CD), which are typically the line widths of the features. One feature is separated from an adjacent feature by a space and the pitch or period is the distance from a point on a feature to the same point on an adjacent feature or the line width plus the space. Periodic or dense features of the mask are defined to be those features of the mask in which the line width is equal to the spacing between the features. For example, dense features may have a 30 nm line width and a 60 nm pitch. Isolated or semi-isolated features of the mask are defined as those features of the mask in which the line width is less than the spacing between features. For example, isolated features may have a 30 nm line width and a 200 nm pitch. The features of the mask are imaged onto the wafer such that the wafer is also characterized by its own critical dimensions, which are proportional to, though generally smaller than, the critical dimensions of the mask.

As discussed below, one problem often encountered in photolithography is a conflict between the conditions needed for proper printing of the isolated features and the conditions needed for proper printing of the dense features. That conflict may be realized or understood when analyzing how the line width of the wafer features varies as the imaging system is de-focused.

In a reflective mask (such as reflective mask 225), phase error may be induced at the boundary between the mask reflector (such as reflector 240) and the absorber (such as absorber 230). Such a phase error is caused by the interaction of the radiation reflected from the mask reflector and the radiation scattered at the boundary between the absorber and the reflector. The induced phase error causes a pitch-dependent shift in focus, where focus is a characteristic of the imaging system. The phase error also causes a process window tilt that is exhibited in the isolated features. The process window is the range of focus and exposure dose of the imaging system that produces an adequate or useful wafer. The effect of pitch-dependent focus shift and process window tilt greatly reduces the common process window for the dense and isolated features.

Figure 3A:
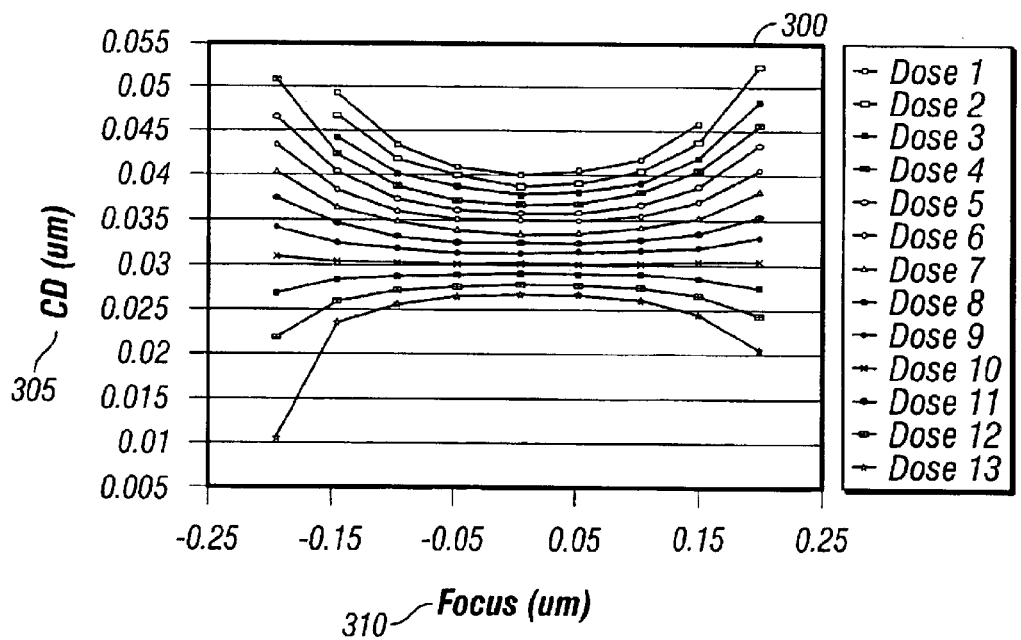
FIGS. 3A and 3B are graphs of the critical dimension of a wafer versus de-focus of the imaging system for, respectively, dense and isolated features of the mask fabricated using the process of FIGS. 2A–2E.
Figure 3B:
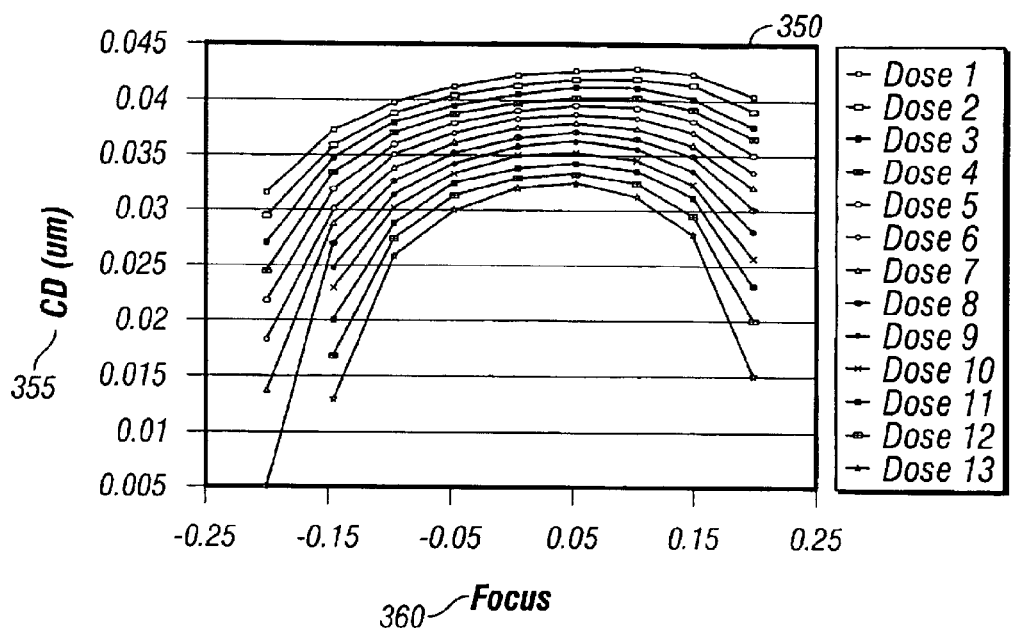

FIG. 3A shows a graph 300 of the line width 305 (in micrometers or $\mu m$) of the wafer versus de-focus 310 (in $\mu m$) of the imaging system for dense features of the mask having a width of 30 nm. FIG. 3B shows a graph 350 of the line width 355 (in $\mu m$) of the wafer versus de-focus 360 (in $\mu m$) for isolated features of the mask having a width of 30 nm. The graphs 300, 350 are outputs of a simulation of the performance of the mask 225. In these simulations, the structure of the mask 225 is such that the substrate is made of $SiO_2$ having a thickness of 28 nm, the reflector 240 is made of Mo/Si stack in which the Mo has a thickness of 2.76 nm and the Si has a thickness of 4.14 nm, the buffer layer is eliminated, and the absorber is made of TaN at a thickness of 100 nm. Additionally, in these simulations, the radiation wavelength is 13.42 nm, the numerical aperture of the imaging system is 0.25, and the angle of incidence (θ) of the radiation, relative to the normal to the surface of, for example, the mask, is 5°.

The shapes of the graphs 300, 350 depend on the exposure dose of the radiation to the wafer. As is evident from the graphs 300, 350, there exists a shift in focus from the isolated features in FIG. 3B relative to the dense features in FIG. 3A. Moreover, the process window for the isolated features in FIG. 3B is asymmetric or tilted. Because of these problems, the common process window for both the isolated and the dense features is reduced.

To correct the problems of pitch-dependent focus shift and process window tilt and to maintain the common process window above a threshold level suitable for semiconductor wafer imaging, an opposite phase shift may be induced during fabrication of the mask to compensate for the phase error, as discussed below.

Referring also to FIGS. 4A–4G, a mask 425 may be formed with a thin layer 442 deposited as an additional top layer on ML reflector 440. During etching, the thin layer 442 is removed at portions 443 adjacent the features of the mask. The material for the thin layer is selected to offset the phase shift.

Figure 4A:
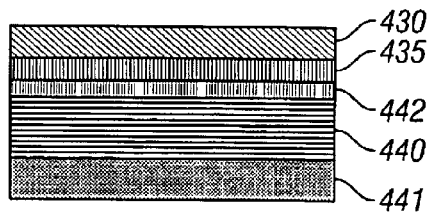
FIGS. 4A–4G are cross-sectional representations of a mask at different phases of a fabrication process in which a thin layer is deposited on a reflector of the mask.

Referring to FIG. 4A, the mask is prepared by depositing the ML reflector 440 on a mask blank 441, depositing the thin layer 442 on the reflector 440, depositing a buffer 435 on the thin layer 442, and depositing an absorber 430 on the buffer 435. Examples of deposition techniques are discussed above with respect to FIG. 2A.

Figure 4B:
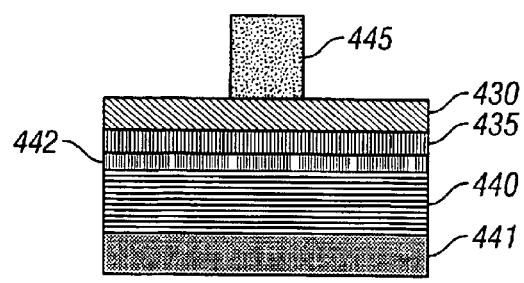
Figure 4C:
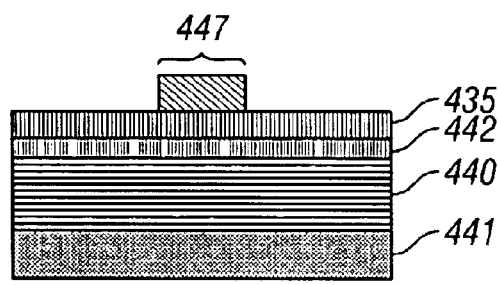
Figure 4D:
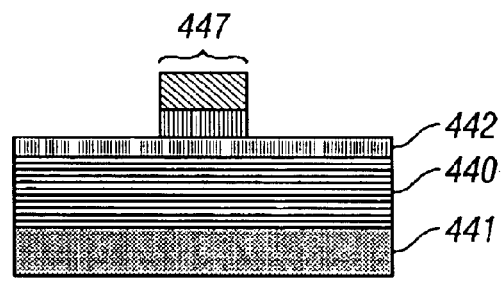
Figure 4E:
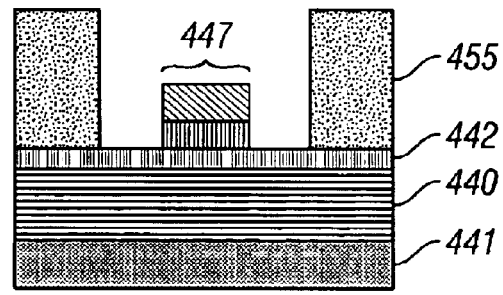
Figure 4F:
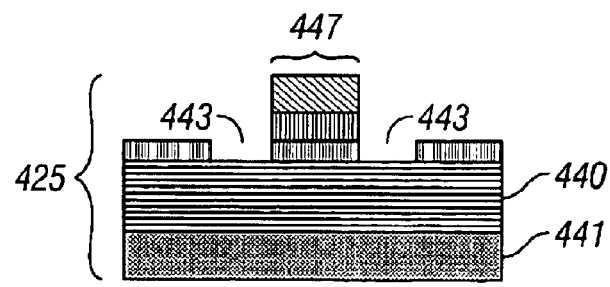
Figure 4G:
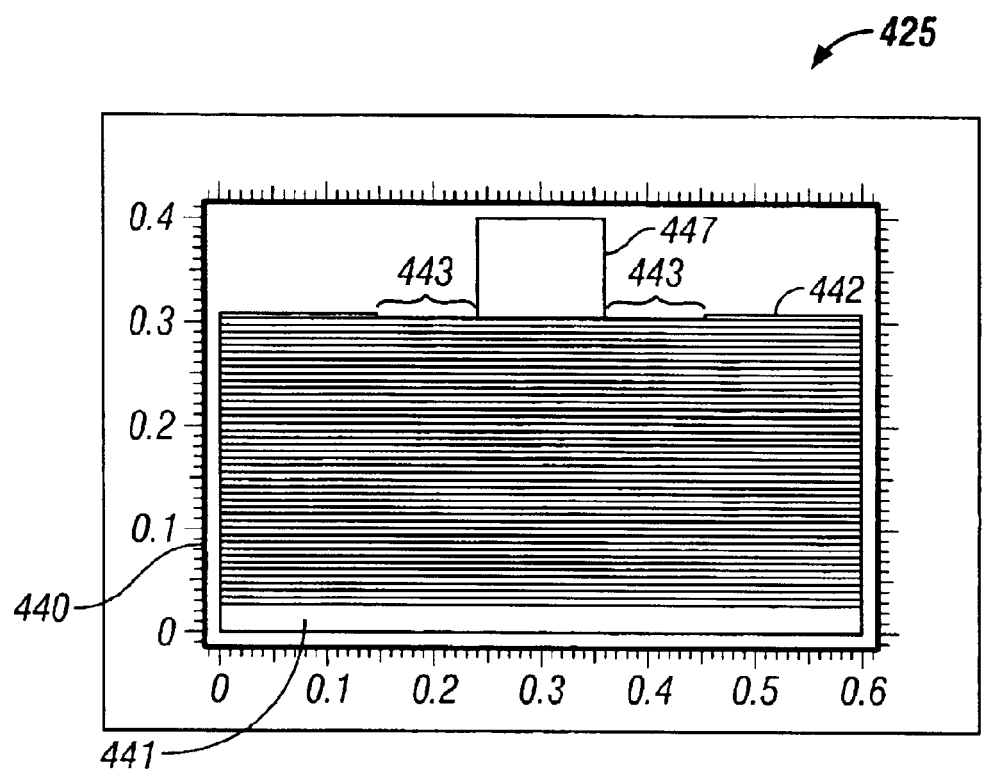

Next, as shown in FIG. 4B, a photoresist 445 is patterned on top of the absorber 430 and, as shown in FIG. 4C, that pattern is replicated into the absorber 430 by etching the absorber 430 in locations not covered by the photoresist 445 to form the mask features 447. Next, as shown in FIG. 4D, the photoresist 445 is selectively removed and the buffer 435 is etched in locations not covered by the absorber 430. As shown in FIG. 4E, another photoresist 455 is patterned on top of the thin layer 442. Finally, as shown in FIG. 4F, the pattern is replicated into the thin layer 442 by etching the thin layer 442 in locations not covered by the photoresist 455 or the absorber 430 and then selectively removing the photoresist 455 to form the mask 425.

The etched mask pattern ultimately will be used to to pattern the semiconductor wafer using the projection optics and the condenser optics, as discussed above. In one implementation, as discussed above, the mask is etched using plasma etching.

Figure 4H:
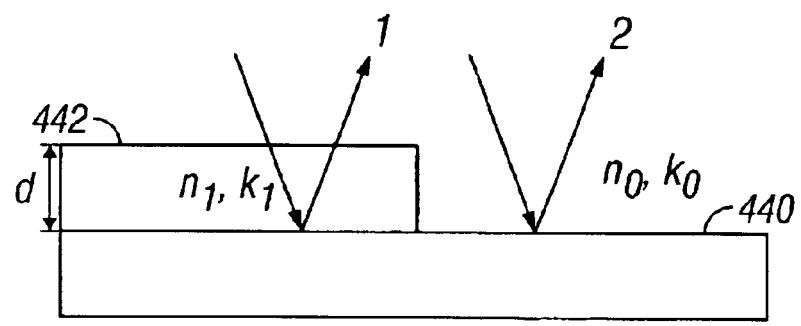
FIG. 4H is a cross-sectional representation of reflection at an interface between the thin layer and the reflector in the mask fabricated using the process of FIGS. 4A–4G.

Referring also to FIG. 4H, the difference in phase shift (Δϕ) between radiation reflected from the thin layer 442 and radiation reflected from the reflector 440 is given by:

$$\Delta\phi = \frac{4\pi}{\lambda}\Delta n \times \frac{d}{\cos\theta} \text{ (in radians)} = \frac{720}{\lambda}\Delta n \times \frac{d}{\cos\theta} \text{ (in degrees)},$$

where λ is the wavelength of the radiation from the radiation source; Δn is $n_1-n_v$, where $n_1$ is the real part of the index of refraction of the thin layer and $n_v$ is the real part of the index of refraction of vacuum; θ is the angle of incidence of the radiation from the radiation source; and d is the thickness of the thin layer.

In one implementation, the thin layer is made of Ru, in which Δn=0.11063. In this case, if the thickness d of the Ru layer is 3 nm, then Δϕ=18° if the wavelength λ of the radiation is 13.4 nm. As another example, if the thin layer is made of silicon dioxide ($SiO_2$), if the thickness d of the $SiO_2$ layer is 3 nm, then Δn=0.02137 and Δϕ=3.4° if the wavelength λ of the radiation is 13.4 nm. By contrast with Ru, if using $SiO_2$, a thickness d of 16 nm is required to obtain a phase correction of 18°. As a result, light would be attenuated by the thick layer of $SiO_2$. Other possible materials that may be used for the thin layer 442 include, for example, Mo, moly-silicide (MoSi), or any other materials that produce a phase correction without an unacceptable amount of light attenuation.

Referring again to FIG. 4F, the thin layer 442 is etched at locations adjacent to the absorber feature 447. If the thin layer is made of 3 mm thick Ru, and if the Ru is etched to have a width of 5 nm to 20 nm (1×) near the edge of the feature 447, a phase error (10 to 30 degrees) at the feature edge is generated. This phase error has the opposite sign as the phase error induced in the EUVL imaging system 100 and responsible for the pattern pitch-dependent focus shift. The two phase errors therefore cancel each other and pitch-dependent focus shift is corrected.

Figure 5:
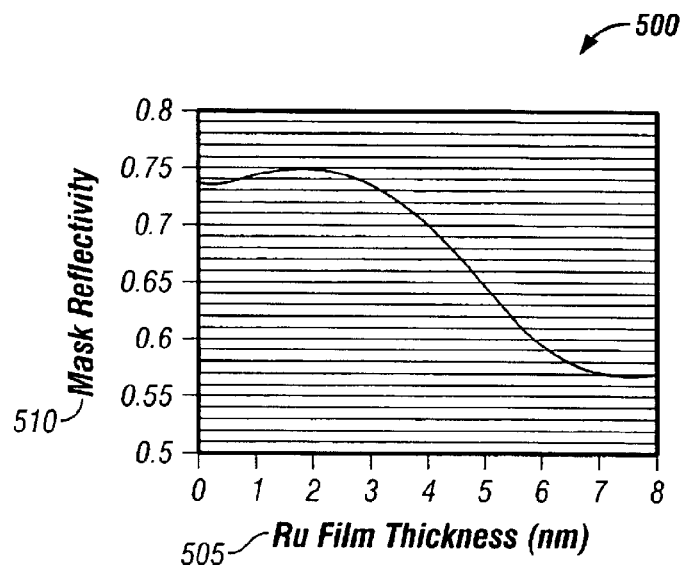
FIG. 5 is a graph of reflectivity of the mask versus a thickness of the thin layer in the mask fabricated using the process of FIGS. 4A–4G.

FIG. 5 shows a graph 500 of mask reflectivity relative to the thickness of a thin layer made of Ru deposited on an ML reflector 440 made of 40 pairs of Mo/Si layers. As the Ru layer thickness 505 increases above 3 nm, the mask reflectivity reduces significantly. As can be seen from the graph, to obtain a reflectivity of better than 0.70, the Ru layer generally should have a thickness 505 less than or equal to 4 nm. As shown, the reflectivity levels off to 0.75 with a Ru layer having a thickness 505 less than 3 nm. In general, if the Ru has a thickness less than 4 nm, then the Ru may be etched to have a width of 5 nm to 30 nm (1×) near the edge of the feature to obtain a suitable phase error.

Figure 6:
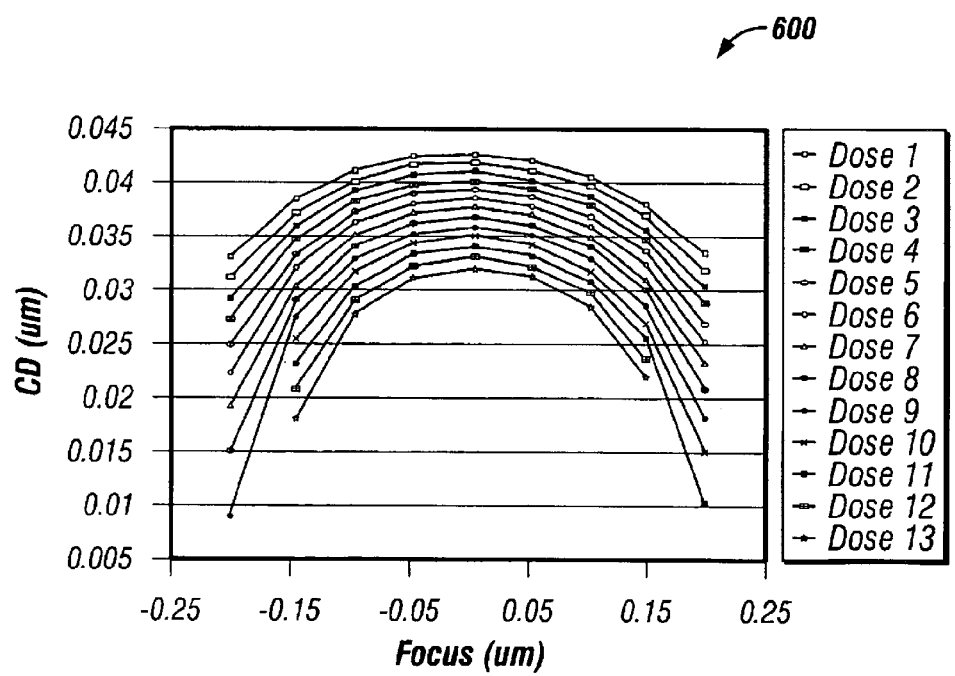
FIG. 6 is a graph of the critical dimension of a wafer versus de-focus of the imaging system for isolated features of the mask fabricated using the process of FIGS. 4A–4G.

FIG. 6 shows simulation results (graph 600) of mask performance for the mask 425. These results show the line width 605 (in μm) versus de-focus 610 (in μm) for various exposure doses. In these simulations, the structure of the mask 425 is such that the substrate is made of $SiO_2$ having a thickness of 28 nm, the reflector 440 is made of Mo/Si stack in which the Mo has a thickness of 2.76 nm and the Si has a thickness of 4.14, the buffer layer is eliminated, the absorber is made of TaN at a thickness of 100 nm, and the thin layer 442 is made of Ru having a thickness of 3 nm. Additionally, in these simulations, the radiation wavelength is 13.42 nm, the numerical aperture of the imaging system is 0.25, and the angle of incidence θ of the radiation is 5°. The simulated etched width on each side of the mask feature 447 is 16 nm at 1× scale, or 64 nm at the 4× mask scale. As is evident from the graph 600, both the focus shift and process widow tilt of the isolated features are corrected. Accordingly, the common process window of the mask is maintained above a level to enable semiconductor mask imaging.

Referring also to FIGS. 7A–7G, a mask 725 or 765 may be formed in which trenches are etched directly into portions 743 of the reflector 740 that are adjacent the features of the mask. In this way, a phase shift is created directly from the partially-etched reflector 740. As shown, the mask 725 or 765 includes a ML reflector 740 deposited on a mask blank 741, a buffer 735 placed on the ML reflector 740, and an absorber 730 placed on the buffer 735. Initially, as shown in FIG. 2A, the mask is prepared by depositing the ML reflector 740 on the mask blank 741, depositing the buffer 735 on the reflector 740, and depositing the absorber 730 on the buffer 735. Particular deposition techniques are discussed above with respect to FIG. 2A. Because the reflector 740 will be etched, it is advantageous to add a few extra layers to the ML reflector in the deposition of the ML reflector.

Figure 7A:
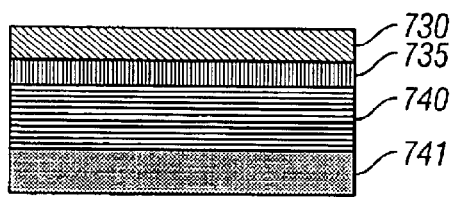
FIGS. 7A–7G are cross-sectional representations of a mask at different phases of a fabrication process in which a trench is etched into a reflector of the mask.
Figure 7B:
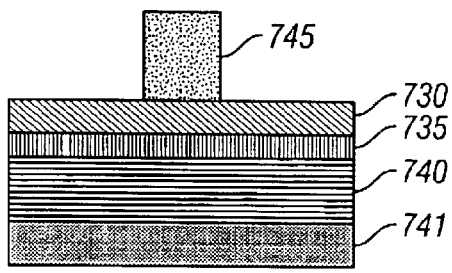
Figure 7C:
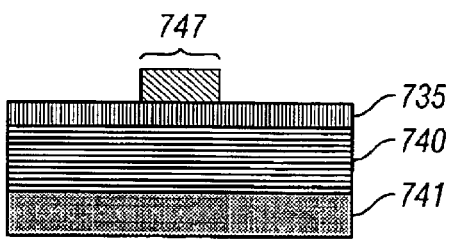

Next, as shown in FIG. 7B, a photoresist 745 is patterned on the absorber 730 and, as shown in FIG. 7C, that pattern is replicated into the absorber 730 by etching the absorber 730 in locations not covered by the photoresist 745 to form the mask features 747. Next, as shown in FIGS. 7D and 7E, the photoresist 745 is selectively removed and the buffer 735 is etched in locations not covered by the absorber 730.

Figure 7D:
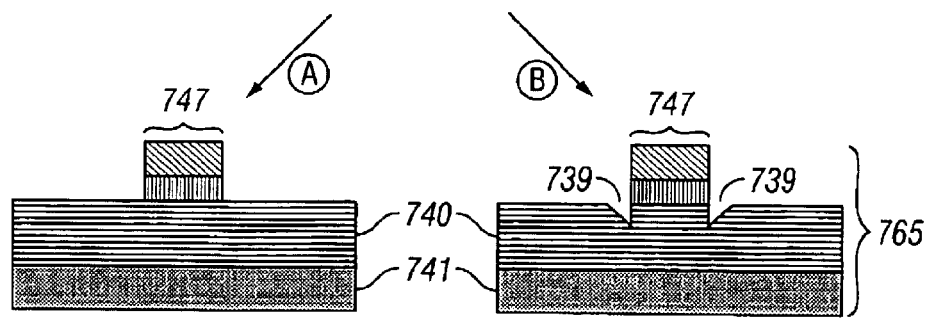
Figure 8:
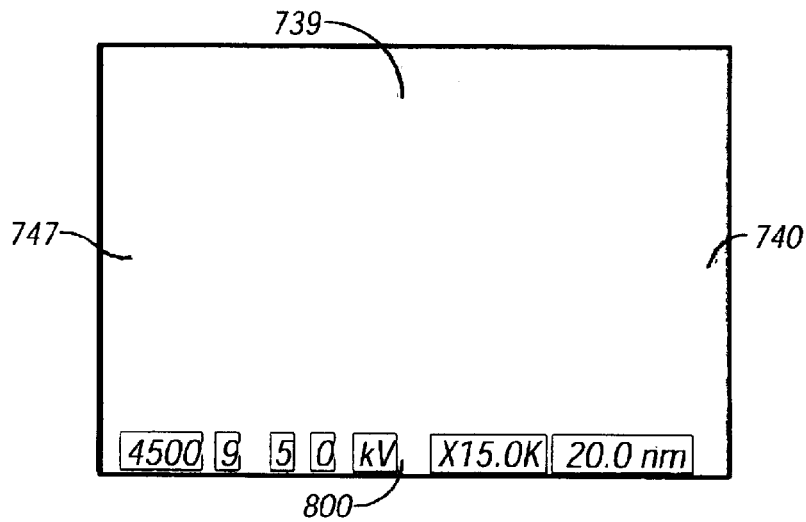
FIG. 8 is a photograph of a mask fabricated using the process of FIGS. 7A–7G.

As shown in FIGS. 7D, two ways of etching the buffer 735 include etching the buffer in the traditional manner (A) or etching the buffer so that a trench 739 is formed in the reflector 740 (B). This may be accomplished by etching the buffer faster at the edge of the feature 747 than at other locations along the buffer (a process referred to as microtrenching). At this point, if the buffer is etched according to the second manner (FIG. 7D–B), then no additional resist processes are required and the mask 765 is formed. As shown in FIG. 8, the trench 739 is visible in a photograph of a portion 800 of a mask 765 made using the process shown in FIGS. 7A–7D.

Figure 7E:
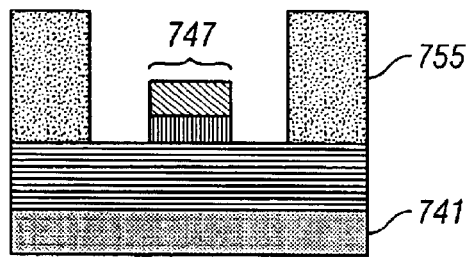
Figure 7F:
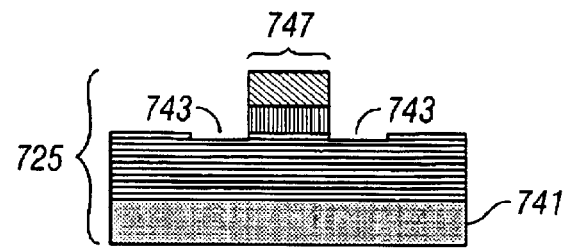
Figure 7G:
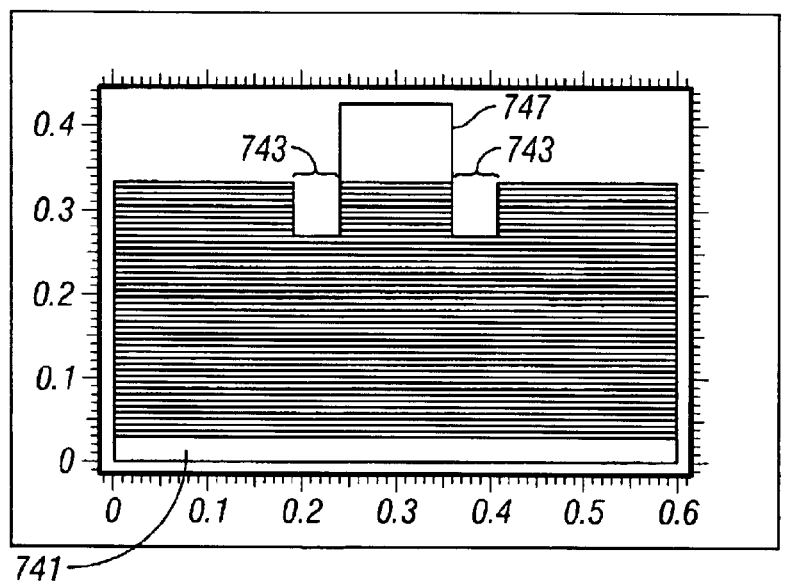

If the buffer is etched according to the first manner (FIG. 7D–A), then, as shown in FIG. 7E, another photoresist 755 is patterned on top of the reflector 740. As shown in FIG. 7F, the pattern is replicated into the reflector 740 by etching the reflector 740 (through, for example, about 4 pairs of the ML) in locations not covered by the photoresist 755 or the absorber 730 and then photoresist 755 is selectively removed to form the mask 725. The etched mask pattern ultimately will be used to pattern the semiconductor wafer using the projection optics and the condenser optics, as discussed above. In one implementation, as discussed above, the mask is etched using plasma etching.

The difference in phase shift ($\Delta\phi$) between radiation reflected from the trench and etched region of the reflector 740 and the non-etched region of the reflector 740 may be estimated by calculating the phase shift $\Delta\phi_1$ at each layer l of the non-etched reflector region (where a layer 1 of the reflector may be a layer of the reflecting material or a layer of the transmissive material) and then adding all the phase shifts $\Delta\phi_1$ over the number of layers:

$$\Delta\phi = \sum_l \Delta\phi_l = \sum_l \frac{4\pi}{\lambda} \Delta n_l \times \frac{d_l}{\cos\theta} \text{ (in radians)},$$

where $\lambda$ is the wavelength of the radiation from the radiation source; $\Delta n_1$ is $n_1-n_v$, where $n_1$ is the real part of the index of refraction of the reflector 740 and $n_v$ is the real part of the index of refraction of vacuum; $d_1$ is the thickness of the layer in the multilayer reflector. This equation only provides an estimate of the total phase shift. To determine that actual phase shift, the interference of light reflecting at each layer must be considered. Thus, using the estimate, if the reflector 740 is made of multiple layers of Mo and Si, if the thickness $d_1$ of each layer is 4.14 nm for Si or 2.76 nm for Mo, and if the number of layers 1=8 (or 4 pairs of Mo/Si), then $\Delta n_1$ equals 0.07257 for Mo, $\Delta n_1$ equals $6.7\times10^{-5}$ for Si, and $\Delta\phi$ equals 35° if the wavelength $\lambda$ of radiation is 13.4 nm.

Figure 9A:
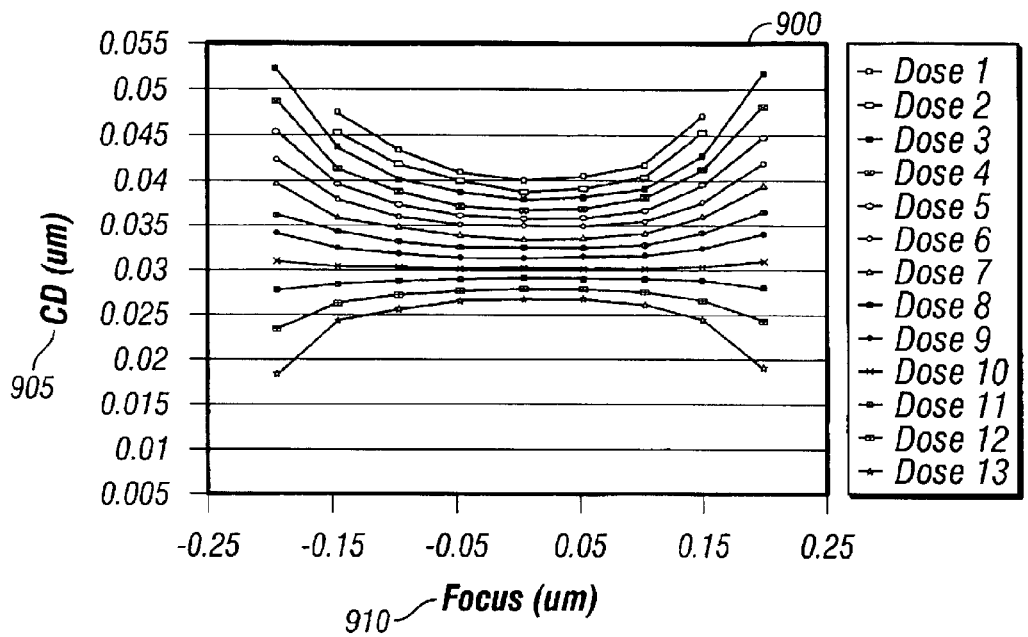
FIGS. 9A and 9B are graphs of the critical dimension of a wafer versus de-focus of the imaging system for, respectively, dense and isolated features of the mask fabricated using the process of FIGS. 7A–7G.
Figure 9B:
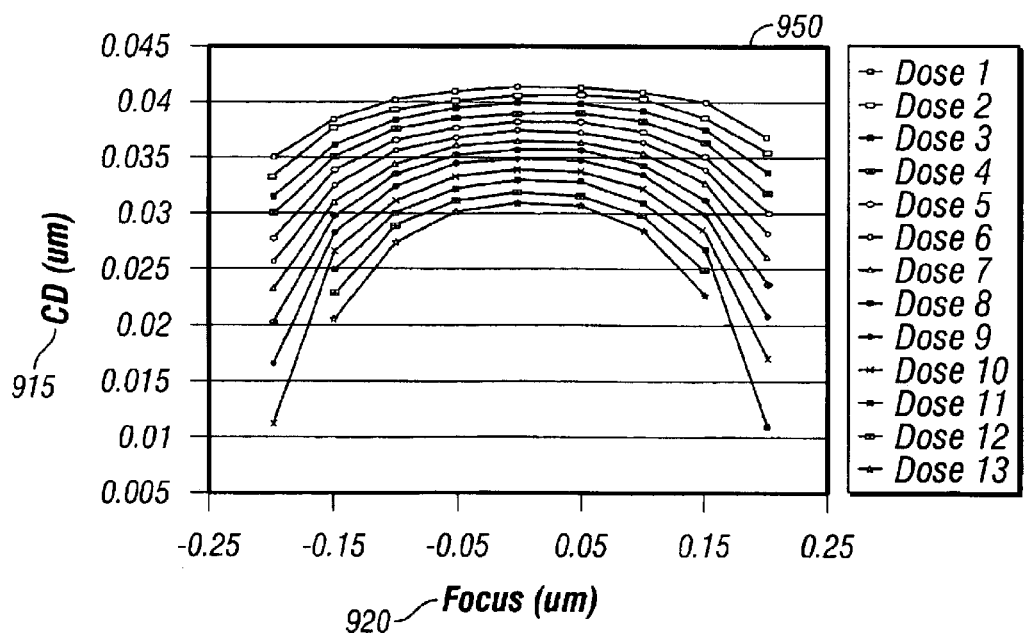

Referring also to FIGS. 9A and 9B, simulation results (graphs 900 and 950) of mask performance for the mask 765 is given. These results show the line width (in $\mu$m) 905 versus de-focus (in $\mu$m) 910 for various exposure doses of the dense features and the line width (in $\mu$m) 915 versus de-focus (in $\mu$m) 920 for various exposure doses of the isolated features. In these simulations, the structure of the mask 765 is such that the substrate is made of $SiO_2$ having a thickness of 28 nm, the reflector 740 is made of Mo/Si stack in which the Mo has a thickness of 2.76 nm and the Si has a thickness of 4.14, the buffer layer is eliminated, the absorber is made of TaN at a thickness of 100 nm, and 4 pairs of ML (at a depth of about 28 nm) are etched into the reflector 740 such that the width of the trench on one side of the feature 747 is 6 nm at a 1× scale or 24 nm at a 4× scale. Again, there is a trade off between the thickness of the trench and the width of the trench. Additionally, in these simulations, the radiation wavelength is 13.42 nm, the numerical aperture of the imaging system is 0.25 and the angle of incidence θ of the radiation is 5°. As is evident from the graphs 900 and 905, both the focus shift and process widow tilt of the isolated features are corrected. Accordingly, the common process window of the mask is maintained above a level to enable semiconductor mask imaging.

3) Refractive Index Matching of Absorber and Buffer

Figure 10:
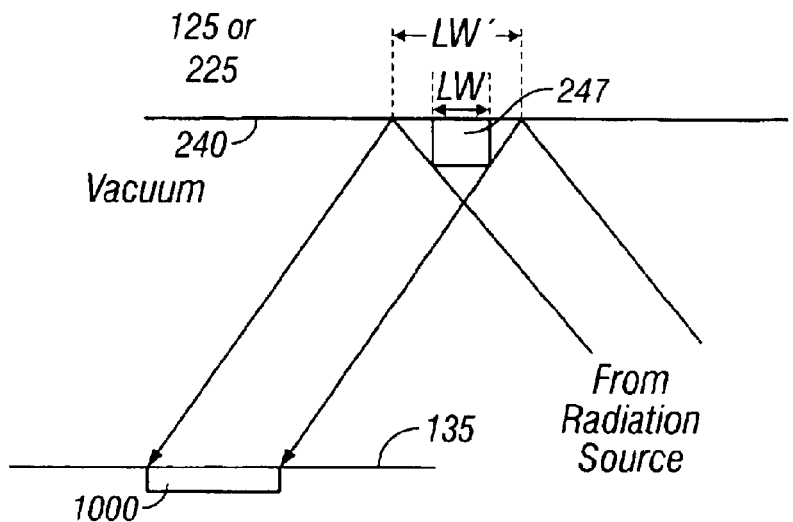
FIG. 10 is a diagram showing a shadowing effect during photolithography.

Another problem encountered in photolithography is a mask biasing limitation in mask fabrication due to a shadowing effect (which may be particularly problematic in EUVL). Referring also to FIG. 10, the shadowing effect occurs during photolithography because radiation from the radiation source 105 impinges the mask 125 at a non-normal angle. Because of this, radiation reflected from the mask 125 is not as sharp or defined, which has the effect of making the line width (LW) of a feature appear to be greater (LW') than it actually is. Because of this, the corresponding targeted print feature 1000 on the wafer 135 will be larger than desired. To ensure the targeted print feature 1000 will have the correct size, the mask 125 may be biased such that, for example, for a positive resist, a mask line width would be made smaller than it would otherwise be made. For example, if the targeted print feature 1000 should be 15 to 20 nm, then the mask line width should be 80 nm. However, such a mask line width, because of the shadowing effect, actually produces a targeted print feature 1000 of 30 nm. To produce a targeted print feature 1000 of 15 to 20 nm, the mask line width must be decreased to about 50 nm. Such a limitation on the size of the line width creates problems with mask fabrication that may, for example, require a new tool set or process.

To reduce the shadowing effect, materials for the absorber 230 and the buffer 235 are selected that have indices of refraction ($n_a$ and $n_b$, respectively) that match or nearly match with the index of refraction ($n_v$) of the atmosphere in which the photolithography imaging takes place (which is typically a vacuum or a near vacuum for EUVL and other techniques). The index of refraction $n_v$ in a vacuum is 1. In atmospheres that include gases, the index of refraction n may be approximated as 1. In the following discussion, it is assumed for the sake of clarity that the atmosphere is a vacuum. The difference in index of refraction ($\Delta n = n_v - n_{a,b}$) or the percentage difference ($\Delta n/n_v \times 100$) may be a gauge of the near matching between $n_a$ or $n_b$ and $n_v$. One commonly used absorber material is TaN, which has an index of refraction of 0.92724 at the wavelength of 13.4 nm. For TaN, the difference in index of refraction, $\Delta n$, is 0.07276, and the percentage difference is about 7.3%. One type of buffer material that may be used is Ru, which has an index of refraction of 0.88984 at the wavelength of 13.4 nm. For Ru, the difference in index of refraction, $\Delta n$, is 0.11016, and the percentage difference is about 11.0%. One other commonly used absorber material is chromium (Cr), which has an index of refraction of 0.93333 at the wavelength of 13.4 nm. For Cr, the difference in index of refraction, $\Delta n$, is 0.06667, and the percentage difference is 6.7%.

The index of refraction of the material nearly matches the index of refraction of the vacuum if a percentage difference between the index of refraction of the material and the index of refraction of the vacuum is less than 5%. Materials for the buffer 235 that meet these criteria include aluminum, germanium, silicon, or mixtures of these materials, such as, for example, silicon-germanium alloy (SiG) or aluminum-silicon alloy (AlSi). Similarly, materials for the absorber 230 that meet these criteria include aluminum, germanium, silicon, or mixtures of these materials, such as, for example, silicon-germanium alloy (SiG) or aluminum-silicon alloy (AlSi). Although Si has a low absorption coefficient at EUV wavelengths, compounds made with Si may be used as materials for both the buffer 235 and the absorber 230. For example, Al has an index of refraction of 1.00253 at the wavelength of 13.4 nm, which results in a percentage difference of about 0.3%. As another example, Ge has an index of refraction of 0.00539 at the wavelength of 13.4 nm, which results in a percentage difference of about 0.5%.

A buffer 235 made of these materials may be deposited on the reflector 240 using a low temperature sputtering process (for example, as discussed with respect to FIG. 2A). Similarly, an absorber 230 made of these materials may be deposited on the reflector 240 using a low temperature sputtering process (for example, as discussed with respect to FIG. 2A). The absorber 230 and the buffer 235 may be etched using a $Cl_2$ or $F_2$ based dry etch chemistry (for example, as discussed with respect to FIGS. 2C and 2D).

Figure 11:
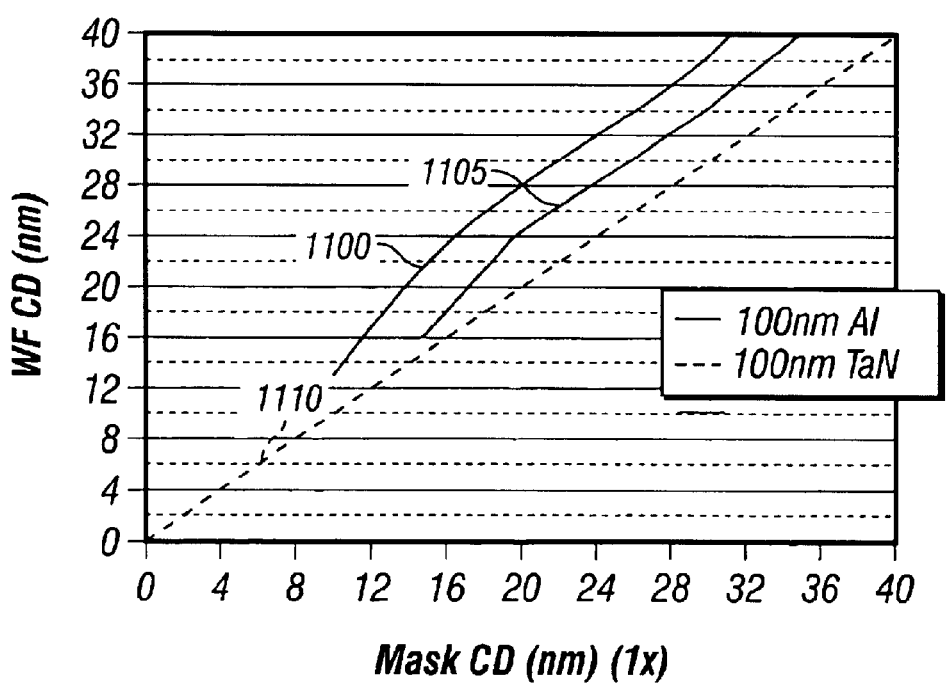
FIG. 11 is a graph of the critical dimension of a wafer versus the critical dimension of a mask patterned to image the wafer.

FIG. 11 shows a graph of the line width (in nm) of a wafer 135 versus the line width (in nm) of a mask 125 (in 1×) that imaged that wafer for TaN (a material typically used for mask absorber 230) 1100 and for Al (a material used for mask absorber 230 having a nearly matched index of refraction) 1105. FIG. 11 also shows a graph 1110 representing the optimum relationship between the wafer line width and the mask line width. These graphs are produced by a simulation that assumes that exposure doses of the wafer are the same for both the TaN and the Al mask absorber. A mask line width of 12 nm (at 1×) or 52 nm (at 4×) is required to print a 20 nm wafer line width if the mask absorber is made of TaN. In contrast, a mask line width of 18 nm (at 1×) or 72 nm (at 4×) is required to print a 20 nm wafer line width if the mask absorber is made of Al.

If the wafer exposure dose changes, the required mask line width may change correspondingly. Nevertheless, for a target wafer line width, the difference between the line width of the Al absorber mask and the TaN absorber mask remains the same. Thus, for example, for a given target wafer line width and exposure dose, the required Al absorber mask line width will always be larger than the required TaN absorber mask line width by about 20 nm.

Another benefit to selecting materials for the absorber 230 and the buffer 235 that have indices of refraction that are matched or nearly matched with the index of refraction ($n_v$) in a vacuum is that process window tilt and focus shift in isolated and dense features are partially corrected relative to when a TaN absorber is used. This effect is shown in FIGS. 12A to 14B, which may be compared to FIGS. 3A and 3B. As discussed, FIG. 3A shows the graph 300 of the line width 305 of the wafer versus de-focus 310 for mask features that are dense and have a line width of 30 mm. FIG. 3B shows the graph 350 of the line width 355 of the wafer versus de-focus 360 for mask features that are isolated and have a line width of 30 nm. The line widths 305, 355 are simulated for several different exposure doses (1–13). In these simulations, the structure of the mask 225 is such that the buffer layer is eliminated and the absorber is made of TaN at a thickness of 100 nm. Additionally, in these simulations, the radiation wavelength is 13.42 nm, the numerical aperture of the imaging system is 0.25, and the angle of incidence θ of the radiation is 5°.

Figure 12A:
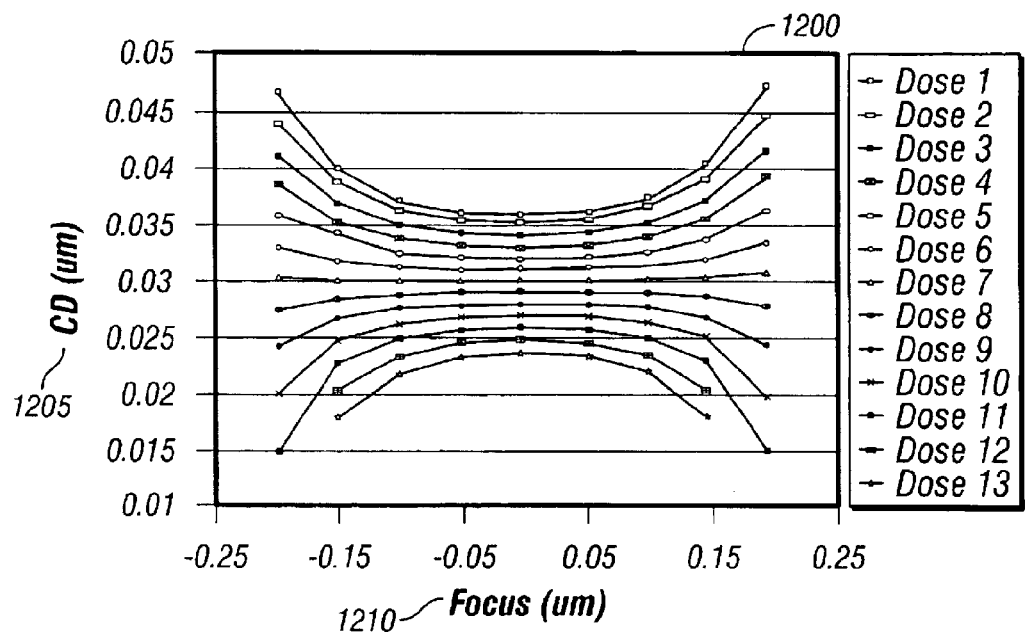
FIGS. 12A and 12B are graphs of the critical dimension of a wafer versus de-focus of the imaging system for, respectively, dense and isolated features of the mask fabricated with an absorber made of germanium using the process of FIGS. 2A–2E.
Figure 12B:
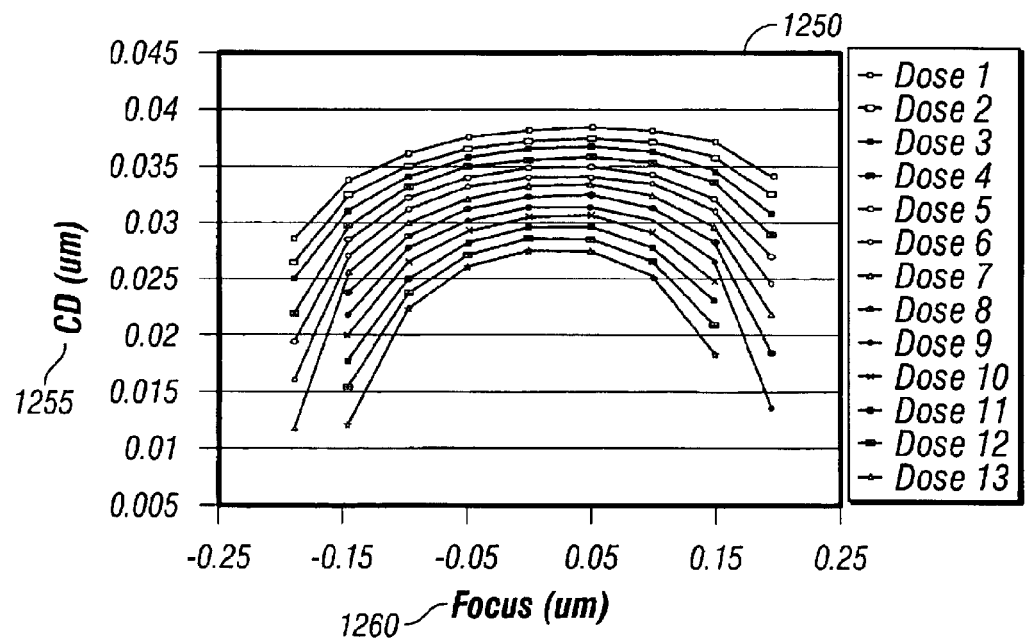

FIG. 12A shows a graph 1200 of the line width 1205 of the wafer versus de-focus 1210 for mask features that are dense and have a line width of 30 mm. FIG. 12B shows the graph 1250 of the line width 1255 of the wafer versus de-focus 1260 for mask features that are isolated and have a line width of 30 nm. The line widths 1205, 1255 are simulated for several different exposure doses (1–13). In these simulations, the structure of the mask 225 is such that the buffer layer is eliminated and the absorber is made of Ge at a thickness of 100 nm. Additionally, in these simulations, the radiation wavelength is 13.42 nm, the numerical aperture of the imaging system is 0.25, and the angle of incidence θ of the radiation is 5°.

Figure 13A:
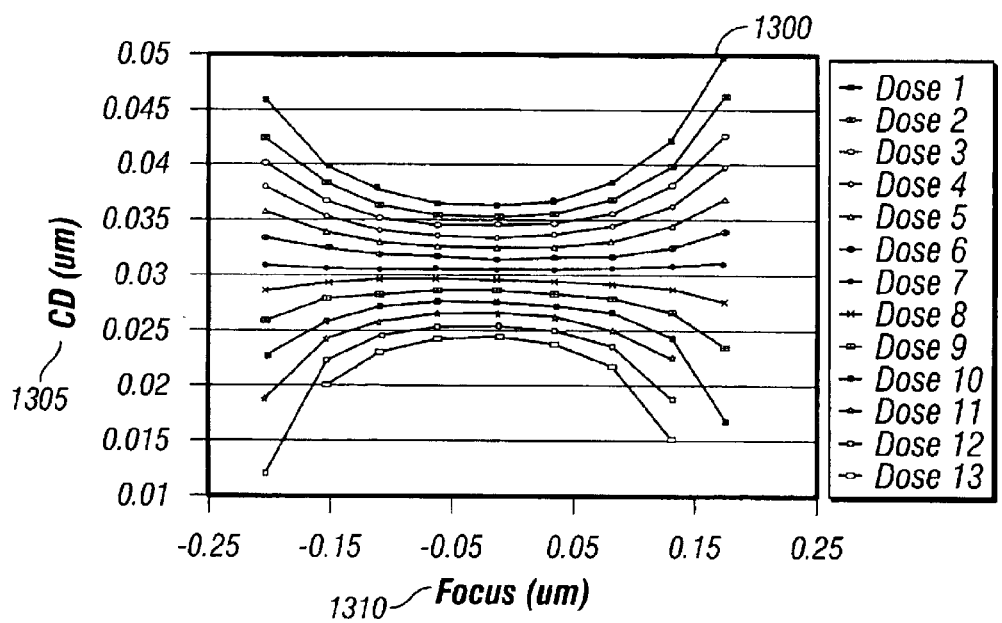
FIGS. 13A and 13B are graphs of the critical dimension of a wafer versus de-focus of the imaging system for, respectively, dense and isolated features of the mask fabricated with an absorber made of aluminum using the process of FIGS. 2A–2E.
Figure 13B:
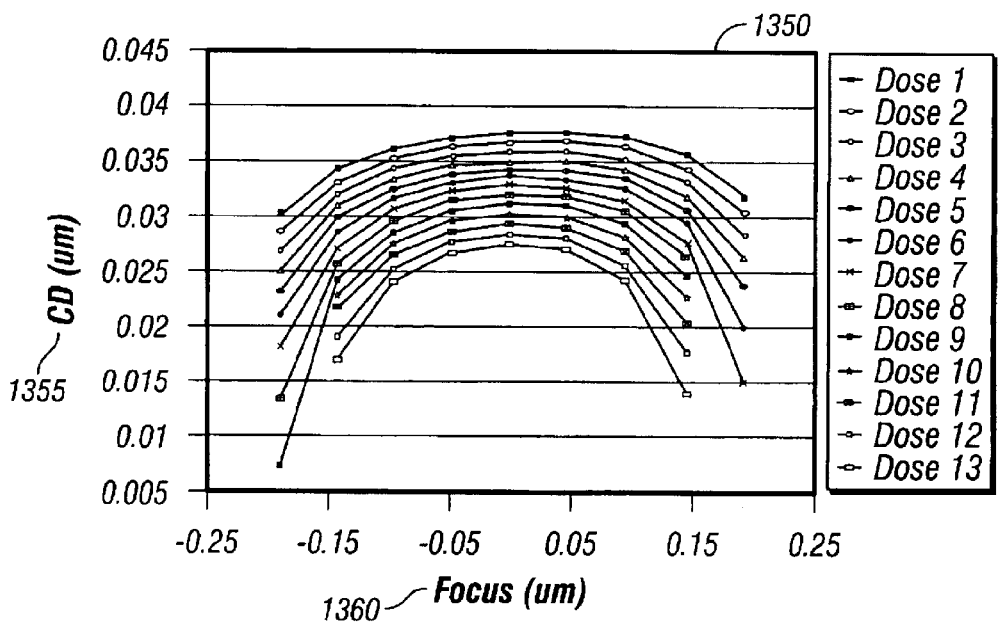

FIG. 13A shows a graph 1300 of the line width 1305 of the wafer versus de-focus 1310 for mask features that are dense and have a line width of 30 mm. FIG. 13B shows the graph 1350 of the line width 1355 of the wafer versus de-focus 1360 for mask features that are isolated and have a line width of 30 nm. The line widths 1305, 1355 are simulated for several different exposure doses (1–13). In these simulations, the structure of the mask 225 is such that the buffer layer is eliminated and the absorber is made of Al at a thickness of 100 nm. Additionally, in these simulations, the radiation wavelength is 13.42 nm, the numerical aperture of the imaging system is 0.25, and the angle of incidence θ of the radiation is 5°.

Figures 14A, 14B:
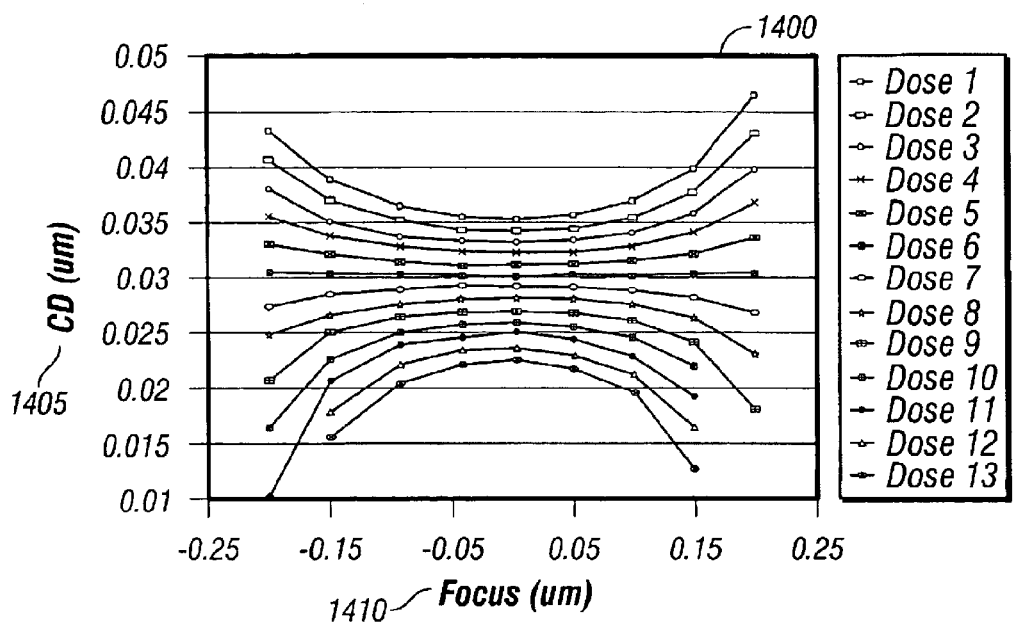
FIGS. 14A and 14B are graphs of the critical dimension of a wafer versus de-focus of the imaging system for, respectively, dense and isolated features of the mask fabricated with an absorber made of aluminum and a buffer made of silicon-germanium alloy using the process of FIGS. 2A–2E.

FIG. 14A shows a graph 1400 of the line width 1405 of the wafer versus de-focus 1410 for mask features that are dense and have a line width of 30 mm. FIG. 14B shows the graph 1450 of the line width 1455 of the wafer versus de-focus 1460 for mask features that are isolated and have a line width of 30 nm. The line widths 1405, 1455 are simulated for several different exposure doses (1–13). In these simulations, the structure of the mask 225 is such that the buffer layer is made of SiGe at a thickness of 30 nm and the absorber is made of Al at a thickness of 80 nm. Additionally, in these simulations, the radiation wavelength is 13.42 nm, the numerical aperture of the imaging system is 0.25, and the angle of incidence θ of the radiation is 5°.

As evident from these graphs, when a matched or nearly matched index of refraction material is used for the absorber and buffer in the mask, the process window tilt and the focus shift in isolated and dense features are at least partially corrected when compared to use of a TaN, a non-near matched index of refraction material.

Other implementations are within the scope of the following claims. For example, the photolithography imaging system may use a radiation source at wavelengths greater than the extreme ultraviolet and imaging may be performed in a reduced atmosphere or an atmosphere suitable to the radiation wavelength. In this case, the absorber or buffer may be matched or nearly matched to the index of refraction of the atmosphere used in the photolithography imaging system.

As discussed, the photolithography imaging system may use a mask that is transmissive. In this case, the mask includes a patterned absorber on a substrate that absorbs radiation at the wavelength at which the mask is patterned. The transmissive mask may include an imaging layer or a buffer on the substrate so that the absorber is not deposited directly on the substrate. During imaging, the image is projected onto the wafer.

In any case, the mask may be made with or without a buffer.

What is claimed is:

1. A method of making a photolithographic mask, the method comprising:

forming a thin layer of a material on a substrate;

forming an absorber on the thin layer; and selectively etching the absorber to form mask features;
in which a thickness and a material of the thin layer are selected to produce a phase correction that offsets a phase error such that a common process window of the mask is maintained above a threshold level.

2. The method of claim 1 in which the phase correction is determined by a wavelength of radiation used to image the mask, a thickness of the deposited thin layer, and an index of refraction value of the thin layer.

3. The method of claim 2 in which the index of refraction value equals an index of refraction of the thin layer minus an index of refraction of an atmosphere at which mask imaging occurs.

4. The method of claim 3 in which the atmosphere at which mask imaging occurs is a vacuum or near vacuum.

5. The method of claim 1 in which the phase correction $\Delta\phi$ equals:

$$\Delta\phi = \frac{4\pi}{\lambda}\Delta n \times \frac{d}{\cos\theta} \text{ (in radians),}$$

in which $\lambda$ is the wavelength of radiation used to image the mask, d is a thickness of the deposited thin layer, $\theta$ is the angle of incidence of the imaging radiation relative to the normal of the mask; and $\Delta n$ equals an index of refraction of the thin layer minus an index of refraction of an atmosphere at which mask imaging occurs.

6. The method of claim 1 further comprising forming a multilayer reflector on the substrate,
in which:
the thickness and the material of the thin layer are selected such that reflectivity of the mask is maintained above a threshold level, and
forming the thin layer on the substrate comprises forming the thin layer on the multilayer reflector.

7. The method of claim 6 in which the multilayer reflector comprises multiple layers of alternating reflecting material and transmissive material that provide a resonant reflectivity.

8. The method of claim 7 in which the reflecting material comprises molybdenum and the transmissive material comprises silicon.

9. The method of claim 7 further comprising depositing a buffer on the thin layer, the buffer serving to protect the reflector during mask etching and repair.

10. The method of claim 1 in which the substrate comprises a material having a low thermal expansion.

11. The method of claim 1 in which the substrate comprises ultralow expansion titanium silicate glass.

12. The method of claim 1 in which the absorber comprises a material that is absorptive of radiation at the wavelength used to image the mask.

13. The method of claim 1 further comprising selectively-etching the thin layer at portions that are adjacent features of the mask.

14. The method of claim 13 in which the selectively etched portions of the thin layer form a trough having a width that is dependent on the thickness of the thin layer and the material of the thin layer.

15. The method of claim 14 in which the thin layer comprises ruthenium and the ruthenium is deposited with a thickness less than 4 nm and having a width in the range of 5 to 30 nm at the scale of the mask.

16. The method of claim 1 in which the thin layer comprises ruthenium.

17. A photolithographic mask comprising:
a substrate;
a thin layer on the substrate, a thickness and material of the thin layer producing a phase correction that offsets a phase error such that a common process window of the mask is maintained above a threshold level; and
an absorber on the thin layer;
in which the absorber is selectively etched to form mask features.

18. The mask of claim 17 in which the phase correction is determined by a wavelength of radiation used to image the mask, a thickness of the deposited thin layer, and an index of refraction value of the thin layer.

19. The mask of claim 18 in which the index of refraction value equals an index of refraction of the thin layer minus an index of refraction of an atmosphere at which mask imaging occurs.

20. The mask of claim 19 in which the atmosphere at which mask imaging occurs is a vacuum or near vacuum.

21. The mask of claim 17 in which the phase correction $\Delta\phi$ equals:

$$\Delta\phi = \frac{4\pi}{\lambda}\Delta n \times \frac{d}{\cos\theta} \text{ (in radians),}$$

in which $\lambda$ is the wavelength of radiation used to image the mask, d is a thickness of the deposited thin layer, $\theta$ is the angle of incidence of the imaging radiation relative to the normal of the mask; and $\Delta n$ equals an index of refraction of the thin layer minus an index of refraction of the atmosphere at which mask imaging occurs.

22. The mask of claim 17 further comprising a multilayer reflector on the substrate,
in which:
the thickness and the material of the thin layer are selected such that reflectivity of the mask is maintained above a threshold level, and
the thin layer on the substrate is formed on the multilayer reflector.

23. The mask of claim 22 in which the multilayer reflector comprises multiple layers of alternating reflecting material and transmissive material that provide a resonant reflectivity.

24. The mask of claim 23 in which the reflecting material comprises molybdenum and the transmissive material comprises silicon.

25. The mask of claim 24 further comprising a buffer deposited on the thin layer, the buffer serving to protect the reflector during mask etching and repair.

26. The mask of claim 17 in which the substrate comprises a material having a low thermal expansion.

27. The mask of claim 17 in which the substrate comprises ultralow expansion titanium silicate glass.

28. The mask of claim 17 in which the absorber comprises a material that is absorptive of radiation at the wavelength used to image the mask.

29. The mask of claim 17 in which the thin layer is selectively etched at portions adjacent features of the mask.

30. The mask of claim 29 in which the selectively-etched portions of the thin layer form a trough having a width that is dependent on the thickness of the thin layer and the material of the thin layer.

31. The mask of claim 30 in which the thin layer comprises ruthenium and the ruthenium is deposited with a thickness less than 4 nm and having a width in the range of 5 to 30 nm at the scale of the mask.

32. The mask of claim 17 in which the thin layer comprises ruthenium.

33. A method of making a photolithographic mask, the method comprising:
   forming a multilayer reflector on a substrate;
   forming an absorber on the multilayer reflector;
   selectively etching the absorber to form mask features; and
   etching at least portions of the multilayer reflector at portions adjacent features of the mask.

34. The method of claim 33 in which the portions of the multilayer reflector are etched to produce a phase correction that offsets a phase error.

35. The method of claim 34 in which the phase correction is determined by a wavelength of radiation used to image the mask, a thickness of the etched portion of the multilayer reflector, and an index of refraction value of the multilayer reflector.

36. The method of claim 35 in which the index of refraction value equals the index of refraction of the multilayer reflector minus the index of refraction of an atmosphere at which mask imaging occurs.

37. The method of claim 36 in which the atmosphere at which mask imaging occurs is a vacuum or near vacuum.

38. The method of claim 33 in which the multilayer reflector comprises multiple layers of alternating reflecting material and transmissive material that provide a resonant reflectivity.

39. The method of claim 38 in which the reflecting material comprises molybdenum and the transmissive material comprises silicon.

40. The method of claim 33 in which the substrate comprises a low thermal expansion material.

41. The method of claim 33 in which the substrate comprises ultralow expansion titanium silicate glass.

42. The method of claim 33 in which the absorber comprises a material that is absorptive of radiation at the wavelength used to image the mask.

43. The method of claim 33 further comprising depositing a buffer on the multilayer reflector, the buffer serving to protect the multilayer reflector during mask etching and repair.

44. The method of claim 33 in which etched portions of the multilayer reflector form a trough having a width that is dependent on the depth of the multilayer reflector etching and the material of the multilayer reflector.

45. A photolithographic mask comprising:
   a substrate;
   a multilayer reflector on the substrate; and
   an absorber on the multilayer reflector and etched to form mask features;
   in which portions of the multilayer reflector are etched adjacent features of the mask.

46. The mask of claim 45 in which the portions of the multilayer reflector are etched to produce a phase correction that offsets a phase error.

47. The mask of claim 46 in which the phase correction is determined by a wavelength of radiation used to image the mask, a thickness of the etched portion of the multilayer reflector, and an index of refraction value of the multilayer reflector.

48. The mask of claim 47 in which the index of refraction value equals the index of refraction of the multilayer reflector minus the index of refraction of an atmosphere at which mask imaging occurs.

49. The mask of claim 48 in which the atmosphere at which mask imaging occurs is a vacuum or near vacuum.

50. The mask of claim 45 in which the multilayer reflector comprises multiple layers of alternating reflecting material and transmissive material to provide a resonant reflectivity.

51. The mask of claim 50 in which the reflecting material comprises molybdenum and the transmissive material comprises silicon.

52. The mask of claim 45 in which the substrate comprises a low thermal expansion material.

53. The mask of claim 45 in which the substrate comprises ultralow expansion titanium silicate glass.

54. The mask of claim 45 in which the absorber comprises a material that is absorptive of radiation at the wavelength used to image the mask.

55. The mask of claim 45 further comprising a buffer deposited on the multilayer reflector, the buffer serving to protect the multilayer reflector during mask etching and repair.

56. The mask of claim 45 in which etched portions of the multilayer reflector form troughs, each trough having a width that is dependent on the depth of the multilayer reflector etching and the material of the multilayer reflector.

57. A method of making a photolithographic mask, the method comprising:
   forming a substrate; and
   forming an absorber on the substrate, wherein the absorber includes aluminum, silicon, a mixture of aluminum, or a mixture of silicon;
   in which an index of refraction of the absorber matches or nearly matches an index of refraction of an atmosphere at which photolithography imaging of the mask occurs.

58. The method of claim 57 in which the absorber index of refraction nearly matches the atmosphere index of refraction if the percentage difference between the absorber index of refraction and the atmosphere index of refraction is less than 5%.

59. The method of claim 57 further comprising selectively etching the absorber to form mask features.

60. The method of claim 59 in which selectively etching the absorber comprises using a dry etch chemistry technique.

61. The method of claim 57 in which depositing the absorber on the substrate comprises using a low temperature sputtering technique.

62. The method of claim 57 further comprising forming a multilayer reflector over the substrate,
   in which forming the absorber on the substrate comprises forming the absorber on the multilayer reflector.

63. The method of claim 62 further comprising depositing a buffer on the multilayer reflector, in which an index of refraction of the buffer matches or nearly matches the index of refraction of the atmosphere at which photolithography imaging of the mask occurs.

64. The method of claim 63 in which the buffer index of refraction nearly matches the atmosphere index of refraction if the percentage difference between the buffer index of refraction and the atmosphere index of refraction is less than 5%.

65. The method of claim 63 further comprising selectively etching the buffer and the absorber to form mask features.

66. The method of claim 65 in which selectively etching the buffer comprises using a dry etch chemistry technique.

67. The method of claim 63 in which depositing the buffer on the multilayer reflector comprises using a low temperature sputtering technique.

68. The method of claim 63 in which the buffer comprises aluminum, germanium, silicon, or mixtures thereof.

69. The method of claim 63 in which the buffer index of refraction nearly matches the atmosphere index of refraction if the percentage difference between the buffer index of refraction and the atmosphere index of refraction is less than 1%.

70. The method of claim 57 in which the absorber index of refraction nearly matches the atmosphere index of refraction if the percentage difference between the absorber index of refraction and the atmosphere index of refraction is less than 1%.

71. The method of claim 57 in which the atmosphere at which mask imaging occurs is a vacuum or near vacuum.

72. A photolithographic mask comprising:
   a substrate; and
   an absorber on the substrate, wherein the absorber includes aluminum, silicon, a mixture of aluminum, or a mixture of silicon;
   in which an index of refraction of the absorber matches or nearly matches an index of refraction of an atmosphere at which photolithography imaging of the mask occurs.

73. The mask of claim 72 in which the absorber index of refraction nearly matches the atmosphere index of refraction if the percentage difference between the absorber index of refraction and the atmosphere index of refraction is less than 5%.

74. The mask of claim 72 in which the absorber includes etched mask features.

75. The mask of claim 72 further comprising a multilayer reflector on the substrate, in which the absorber on the substrate is formed on the multilayer reflector.

76. The mask of claim 75 further comprising a buffer deposited on the multilayer reflector, in which an index of refraction of the buffer matches or nearly matches an index of refraction of an atmosphere at which photolithography imaging of the mask occurs.

77. The mask of claim 76 in which the buffer index of refraction nearly matches the atmosphere index of refraction if the percentage difference between the buffer index of refraction and the atmosphere index of refraction is less than 5%.

78. The mask of claim 77 in which the buffer and the absorber include etched mask features.

79. The mask of claim 76 in which the buffer comprises aluminum, germanium, silicon, or mixtures thereof.

80. The mask of claim 76 in which the index of refraction of the buffer nearly matches the index of refraction of the atmosphere if the percentage difference between the absorber index of refraction and the atmosphere index of refraction is less than 1%.

81. The mask of claim 72 in which the index of refraction of the absorber nearly matches the index of refraction of the atmosphere if the percentage difference between the absorber index of refraction and the atmosphere index of refraction is less than 1%.

82. The mask of claim 72 in which the atmosphere at which mask imaging occurs is a vacuum or near vacuum.

* * * * *